(12) United States Patent
Ichikawa

(10) Patent No.: US 9,846,183 B2
(45) Date of Patent: Dec. 19, 2017

(54) PARAMETER DERIVATION METHOD

(71) Applicant: Murata Manufacturing Co., Ltd., Nagaokakyo-shi, Kyoto-fu (JP)

(72) Inventor: Keiichi Ichikawa, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 412 days.

(21) Appl. No.: 14/744,089

(22) Filed: Jun. 19, 2015

(65) Prior Publication Data

US 2015/0285845 A1 Oct. 8, 2015

Related U.S. Application Data

(63) Continuation of application No. PCT/JP2013/084008, filed on Dec. 19, 2013.

(30) Foreign Application Priority Data

Feb. 14, 2013 (JP) .................................. 2013-026486

(51) Int. Cl.

| | |
|---|---|
| *G01R 21/07* | (2006.01) |
| *G01R 27/02* | (2006.01) |
| *G01R 23/07* | (2006.01) |
| *H02J 5/00* | (2016.01) |
| *H04B 5/00* | (2006.01) |
| *H02J 50/05* | (2016.01) |
| *H02J 7/02* | (2016.01) |

(52) U.S. Cl.
CPC ............. *G01R 21/07* (2013.01); *G01R 23/07* (2013.01); *G01R 27/02* (2013.01); *H02J 5/005* (2013.01); *H02J 50/05* (2016.02); *H04B 5/0037* (2013.01); *H02J 7/025* (2013.01)

(58) Field of Classification Search
CPC ........ G01R 21/07; G01R 23/07; G01R 27/02; H02J 50/05; H02J 5/005; H02J 7/025; H04B 5/0037
See application file for complete search history.

(56) References Cited

U.S. PATENT DOCUMENTS

2012/0025628 A1* 2/2012 Ichikawa .............. H02J 7/0044
307/104
2014/0028114 A1 1/2014 Ichikawa et al.

FOREIGN PATENT DOCUMENTS

| JP | 2011-045161 A | 3/2011 |
|---|---|---|
| JP | 2012-530481 A | 11/2012 |
| JP | 2013-187963 A | 9/2013 |

OTHER PUBLICATIONS

International Search Report issued for PCT/JP2013/084008, dated Feb. 10, 2014.

(Continued)

*Primary Examiner* — Kyoung Lee
(74) *Attorney, Agent, or Firm* — Arent Fox LLP

(57) ABSTRACT

A method for determining parameters of a wireless power transmission system is disclosed where the wireless power transmission system transmits power from a power transmission device to a power reception device via electric field coupling. The parameters include a coupling coefficient ke of an electric field coupling unit that is formed of active electrodes and passive electrodes of the power transmission device and the power reception device.

16 Claims, 4 Drawing Sheets

(56) References Cited

OTHER PUBLICATIONS

Takehiro Imura; "Study of Magnetic and Electric Coupling for Contactless Power Transfer Using Equivalent Circuits—Wireless Power Transfer via Electromagnetic Coupling at Resonance"; The Transactions of the Institute of Electrical Engineers of Japan, vol. 130, No. 1, 2010, pp. 84-92.
Written Opinion of the International Searching Authority, issued for PCT/JP2013/084008, dated Feb. 10, 2014.

* cited by examiner

PARAMETER DERIVATION METHOD

CROSS REFERENCE TO RELATED APPLICATIONS

The present application is a continuation of PCT/JP2013/084008 filed Dec. 19, 2013, which claims priority to Japanese Patent Application No. 2013-026486, filed Feb. 14, 2013, the entire contents of each of which are incorporated herein by reference.

FIELD OF THE INVENTION

The present invention relates to a parameter derivation method for deriving parameters related to electric field coupling in an electric-field-coupling-scheme wireless power transmission system.

BACKGROUND OF THE INVENTION

As an example of a wireless power transmission system, the electric-field-coupling-scheme wireless power transmission system described in Patent Document 1 is known. In this system, an active electrode and a passive electrode of a power transmission device and an active electrode and a passive electrode of a power reception device are brought close to each other with a gap therebetween, whereby the pairs of electrodes become capacitively coupled with each other and power is transmitted from the power transmission device to the power reception device. In Patent Document 1, in each of the power transmission device and the power reception device, a configuration is adopted in which the active electrode is surrounded by the passive electrode and the coupling capacitance between the passive electrodes is made large. Thus, the tolerance with respect to discrepancies between the relative positions of the power transmission device and the power reception device is high and therefore convenience is high. Along with it being possible to realize a high degree of coupling between the power transmission device and the power reception device and make the power transmission efficiency high, size reduction of the devices is also achieved. A central conductor is electrostatically shielded by a structure that surrounds the central conductor with a peripheral conductor and thereby extraneous emissions can be reduced.

Patent Document 1: Japanese Unexamined Patent Application Publication No. 2012-530481

As described in Patent Document 1, in an electric-field-coupling-scheme power transmission system, it is necessary to optimize a coupling capacitance and a coupling coefficient between electrodes in order to make the power transmission efficiency high. In addition, when considering compatibility between many devices, it is necessary to quantify a capacitive coupling unit. However, in the configuration described in Patent Document 1, although the capacitance generated between the electrodes can be made large, the coupling capacitance and coupling coefficient are not known and suitable values for these parameters are not known. Consequently, it is necessary to repeatedly design the active electrodes and the passive electrodes using a so-called "cut and try" process and therefore labor and time are needed.

In addition, in power transmission systems, to date, because the values of coupling capacitances are very small, when a coupling unit has been directly measured, parasitic capacitances generated between the coupling unit and, for example, the probe of a measurement instrument have had an effect and measurement errors have sometimes become large. Consequently, in order to derive the necessary parameters, the necessary parameters have been measured in a state where a transformer unit and the coupling unit are isolated from each other, but in this case there is a problem in that errors are generated in the derived parameters and as a result power transmission cannot be performed with an optimum power transmission efficiency with the final devices that have the transformer units and the coupling unit incorporated therein.

SUMMARY OF THE INVENTION

Accordingly, an object of the present invention is to provide a parameter derivation method that is capable of deriving values of parameters related to practical electric field coupling that are closer to those in an actual operation state in order to increase power transmission efficiency.

The present invention provides a parameter derivation method for a wireless power transmission system that includes a power transmission device that applies an alternating current voltage, which has been stepped up by a step-up transformer, between a first electrode and a second electrode, and a power reception device that steps down with a step-down transformer a voltage induced in a third electrode that faces the first electrode with a gap therebetween and in a fourth electrode that is in contact with the second electrode or faces the second electrode with a gap therebetween and rectifies and smoothes the stepped-down alternating current voltage with a rectification smoothing circuit, the wireless power transmission system transmitting power from the power transmission device to the power reception device via electric field coupling. The parameters include a coupling coefficient ke of an electric field coupling unit formed of the first electrode, the second electrode, the third electrode and the fourth electrode, and the coupling coefficient ke is derived on the basis of Equation 16 (also referred to as Equation (A)) or Equation 17 (also referred to as Equation (B)) using resonant frequencies $\omega_1$ and $\omega_2$ or anti-resonant frequencies $\omega_{00}$ and $\omega_0$ of an input impedance seen from a primary side of the step-up transformer measured in a state where the third electrode and the fourth electrode are open and using a resonant frequency $\omega r$ or an anti-resonant frequency $\omega a$ of the input impedance seen from the primary side of the step-up transformer measured in a state where the third electrode and the fourth electrode are short circuited.

Equation 16

$$k_e = \sqrt{1 - \left(\frac{\omega_a \omega_{eq}}{\omega_{00}\omega_0}\right)^2} \tag{A}$$

where $$\frac{1}{\omega_{eq}^2} = \frac{1}{\omega_0^2} + \frac{1}{\omega_{00}^2} - \frac{1}{\omega_a^2}$$

Equation 17

$$k_e = \sqrt{1 - \left(\frac{\omega_r \omega_{eq}}{\omega_1 \omega_2}\right)^2} \tag{B}$$

where $$\frac{1}{\omega_{eq}^2} = \frac{1}{\omega_1^2} + \frac{1}{\omega_2^2} - \frac{1}{\omega_r^2}$$

With this method, the coupling coefficient ke between the electrodes can be derived and design of the shape and size of the first electrode, the second electrode, the third electrode and the fourth electrode to make the coupling coefficient a certain value or to optimize the coupling coefficient becomes easier. In addition, the power transmission efficiency of the wireless power transmission system can be made high.

It is preferable that the parameters include a capacitance $C_1$ of a first capacitor connected in parallel with a secondary coil of the step-up transformer, a capacitance $C_2$ of a second capacitor connected in parallel with a primary coil of the step-down transformer and a capacitance $C_3$ of a third capacitor connected between the first capacitor and the second capacitor, the first, second and third capacitors forming an equivalent circuit of a capacitive coupling unit, and the capacitance $C_1$, the capacitance $C_2$ and the capacitance $C_3$ are derived using the coupling coefficient ke, a known (measured) equivalent inductance Leq of a resonance circuit including the step-down transformer, a known (measured) self-inductance $L_1$ of the secondary coil of the step-up transformer, and Equations (C) to (G).

Equation 18

$$C_G = \frac{1}{L_1 \omega_a^2} \quad (C)$$

$$C_L = \frac{1}{L_{eq} \omega_{eq}^2} \quad (D)$$

$$C_1 = C_G - C_3 \quad (E)$$

$$C_2 = C_L - C_3 \quad (F)$$

$$C_3 = k_e \sqrt{C_G C_L} \quad (G)$$

With this method, the capacitances $C_1$, $C_2$ and $C_3$ are derived and thereby values of these capacitances can be quantified using a simple equivalent circuit (m-type equivalent circuit using 3 elements) and therefore design of the shape and the size of the electrodes becomes simpler compared with the case where the electrodes are repeatedly designed using a so-called "cut and try" process in order to obtain desired capacitive coupling.

The present invention provides a parameter derivation method for deriving parameters of a wireless power transmission system that includes a power transmission device that applies an alternating current voltage, which has been stepped up by a step-up transformer, between a first electrode and a second electrode, and a power reception device that steps down with a step-down transformer a voltage induced in a third electrode that faces the first electrode with a gap therebetween and in a fourth electrode that is in contact with the second electrode or faces the second electrode with a gap therebetween and rectifies and smoothes the stepped-down alternating current voltage with a rectification smoothing circuit, the wireless power transmission system transmitting power from the power transmission device to the power reception device via electric field coupling. The parameters include a coupling coefficient ke of an electric field coupling unit formed of the first electrode, the second electrode, the third electrode and the fourth electrode, and the coupling coefficient ke is derived on the basis of Equation 16 (also referred to as Equation (A)) or Equation 17 (also referred to as Equation (B)) using resonant frequencies $\omega_1$ and $\omega_2$ or anti-resonant frequencies $\omega_{00}$ and $\omega_0$ of an input impedance seen from a secondary side of the step-down transformer measured in a state where the first electrode and the second electrode are open and using a resonant frequency $\omega r$ or an anti-resonant frequency $\omega a$ of an input impedance seen from the secondary side of the step-down transformer measured in a state where the first electrode and the second electrode are short circuited.

Equation 16

$$k_e = \sqrt{1 - \left(\frac{\omega_a \omega_{eq}}{\omega_{00} \omega_0}\right)^2} \quad (A)$$

where $$\frac{1}{\omega_{eq}^2} = \frac{1}{\omega_0^2} + \frac{1}{\omega_{00}^2} - \frac{1}{\omega_a^2}$$

Equation 17

$$k_e = \sqrt{1 - \left(\frac{\omega_r \omega_{eq}}{\omega_1 \omega_2}\right)^2} \quad (B)$$

where $$\frac{1}{\omega_{eq}^2} = \frac{1}{\omega_1^2} + \frac{1}{\omega_2^2} - \frac{1}{\omega_r^2}$$

With this method, the coupling coefficient ke between the electrodes can be derived and design of the shape and size of the first electrode, the second electrode, the third electrode and the fourth electrode to make the coupling coefficient be a certain value or to optimize the coupling coefficient becomes easier. In addition, the power transmission efficiency of the wireless power transmission system can be made high.

It is preferable that the parameters include a capacitance $C_1$ of a second capacitor connected in parallel with a primary coil of the step-down transformer, a capacitance $C_2$ of a first capacitor connected in parallel with a secondary coil of the step-up transformer and a capacitance $C_3$ of a third capacitor connected between the first capacitor and the second capacitor, the first, second and third capacitors forming an equivalent circuit of a capacitive coupling unit, and the capacitance $C_1$, the capacitance $C_2$ and the capacitance $C_3$ are derived using the coupling coefficient ke, a known (measured) equivalent inductance Leq of a resonance circuit including the step-up transformer, a known (measured) self-inductance $L_2$ of the primary coil of the step-down transformer, and Equations (H) to (L).

Equation 19

$$C_G = \frac{1}{L_2 \omega_a^2} \quad (H)$$

$$C_L = \frac{1}{L_{eq} \omega_{eq}^2} \quad (I)$$

$$C_1 = C_L - C_3 \quad (J)$$

$$C_2 = C_G - C_3 \quad (K)$$

$$C_3 = k_e \sqrt{C_G C_L} \quad (L)$$

With this method, the capacitances $C_1$, $C_2$ and $C_3$ are derived and thereby values of these capacitances can be quantified using a simple equivalent circuit (π-type equivalent circuit using 3 elements) and therefore design of the shape and the size of the electrodes becomes simpler compared with the case where the electrodes are repeatedly designed using a so-called "cut and try" process in order to obtain desired capacitive coupling.

With this method, the coupling coefficient ke between the electrodes can be derived and design of the shape and size of the first electrode, the second electrode, the third electrode and the fourth electrode to make the coupling coefficient be a certain value or to optimize the coupling coefficient becomes easier. In addition, the power transmission efficiency of the wireless power transmission system can be made high.

In addition, by deriving the capacitances $C_1$, $C_2$ and $C_3$, design of the shape and size of the electrodes becomes easier compared with the case where the electrodes are repeatedly designed using a so-called "cut and try" process to obtain desired capacitive coupling. In addition, even if the value of the coupling capacitance is very small, the measurement error can be made small compared with the case where the parameters of the capacitive coupling unit are measured by disconnecting the electrodes and the circuit.

DETAILED DESCRIPTION OF THE EXEMPLARY EMBODIMENTS

Figure 1:
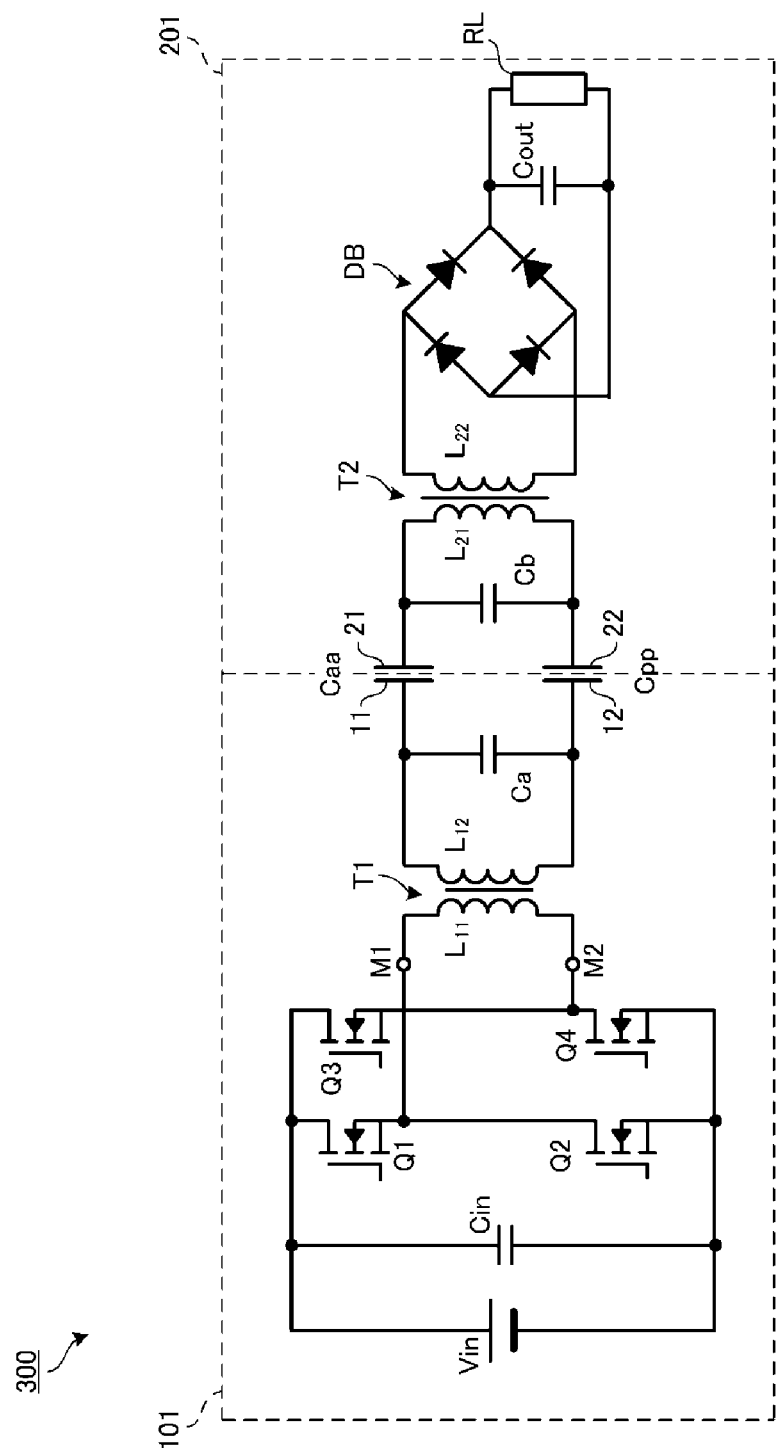
FIG. 1 is a circuit diagram of a wireless power transmission system according to an embodiment.

FIG. 1 is a circuit diagram of a wireless power transmission system 300 according to an embodiment. The wireless power transmission system 300 includes a power transmission device 101 and a power reception device 201. The power reception device 201 includes a load RL. The load RL is a battery module that includes a rechargeable battery and a charging circuit. The power reception device 201 is for example a mobile electronic appliance equipped with a rechargeable battery. Examples of such a mobile electronic appliance include cellular phones, PDAs, portable music players, laptop PCs, digital cameras and so forth. The power reception device 201 is mounted on the power transmission device 101 and the power transmission device 101 charges the rechargeable battery of the power reception device 201.

The power transmission device 101 includes a direct current power supply Vin that outputs DC 5V or 12V. An input capacitor Cin is connected to the direct current power supply Vin. In addition, a DC-AC inverter circuit, which converts a direct current voltage into an alternating current voltage, is connected to the direct current power supply Vin. The DC-AC inverter circuit includes switching elements Q1, Q2, Q3 and Q4 and the switch elements Q1 and Q4 and the switch elements Q2 and Q3 are alternately turned on and off.

A primary coil $L_{11}$ of a step-up transformer T1 is connected to a connection point between the switching elements Q1 and Q2 and a connection point between the switching elements Q3 and Q4. An active electrode 11 and a passive electrode 12 are connected to a secondary coil $L_{12}$ of the step-up transformer T1. The step-up transformer T1 steps up an alternating current voltage and applies the stepped-up alternating current voltage between the active electrode 11 and the passive electrode 12. The frequency of this alternating current voltage is set to be in the range of from 100 kHz to 10 MHz.

A capacitor Ca is connected in parallel with the secondary coil $L_{12}$ of the step-up transformer T1. The capacitor Ca is a stray capacitance generated between the active electrode 11 and the passive electrode 12 or is a combined capacitance made up of the capacitance of a capacitor and the stray capacitance in the case where the capacitor is connected. The capacitor Ca forms a series resonance circuit with a leakage inductance (not illustrated) of the secondary coil $L_{12}$ of the step-up transformer T1.

The power reception device 201 includes an active electrode 21 and a passive electrode 22. When the power reception device 201 is mounted on the power transmission device 101, the active electrode 21 and the passive electrode 22 face the active electrode 11 and the passive electrode 12 of the power transmission device 101 with gaps therebetween. The passive electrodes 12 and 22 may directly contact each other. A capacitor Caa illustrated in FIG. 1 is a capacitance formed between the active electrodes 11 and 21 and a capacitor Cpp is a capacitance formed between the passive electrodes 12 and 22.

A primary coil $L_{21}$ of a step-down transformer T2 is connected to the active electrode 21 and the passive electrode 22. A capacitor Cb is connected to the primary coil $L_{21}$. The capacitor Cb is a stray capacitance generated between the active electrode 21 and the passive electrode 22 or is a combined capacitance made up of the capacitance of a capacitor and the stray capacitance in the case where the capacitor is connected. The capacitor Cb forms a parallel resonance circuit with an excitation inductance of the primary coil $L_{21}$ of the step-down transformer T2.

A diode bridge DB formed of four diodes is connected to a secondary coil $L_{22}$ of the step-down transformer T2. The load RL, which is a rechargeable battery, is connected to the diode bridge DB via a smoothing capacitor Cout.

The power reception device 201 is mounted on the power transmission device 101 and a voltage is applied between active electrode 11 and the passive electrode 12 of the power transmission device 101, whereby the active electrodes 11 and 21 and the passive electrodes 12 and 22, which are arranged so as to face each other, become capacitively coupled with each other and an electric field is generated therebetween. Then, power is transmitted from the power transmission device 101 to the power reception device 201 via the electric field. In the power reception device 201, an alternating current voltage induced by the power transmission is stepped down by the step-down transformer T2, rectified and smoothed by the diode bridge DB and the smoothing capacitor Cout, and then applied to the load RL.

A method for deriving parameters related to capacitive coupling using the active electrode 11, the passive electrode 12, the active electrode 21 and the passive electrode 22 in the thus-configured wireless power transmission system 300 will be described. By deriving the parameters related to capacitive coupling, design of the sizes and the shapes of the active electrodes 11 and 21 and the passive electrodes 12 and 22 will become easier and the time and labor involved in design and trial manufacture can be reduced compared with the case where the design of electrodes is repeatedly performed by trial and error using the so-called "cut and try" process.

First, in order to derive the value of the coupling capacitance, a coupling coefficient ke of the active electrodes 11 and 12 and the passive electrodes 12 and 22 is derived. By deriving the coupling coefficient ke, the size of the capacitive coupling between the electrodes can be obtained and the magnitude of the power transmission efficiency can be determined. The coupling coefficient ke can be derived by measuring the resonant frequency and anti-resonant frequency of a capacitive coupling unit of the power transmission device 101 and the power reception device 201 and using certain equations. M1 and M2 in FIG. 1 indicate measurement locations of the resonant frequency and anti-resonant frequency. In this embodiment, a method for deriving the coupling coefficient ke by focusing on the input impedance when looking at the power reception device 201 side from the measurement locations M1 and M2 will be described. Measurement of the resonant frequency and anti-resonant frequency is not limited to being realized by measurement of impedance Z and the resonant frequency and anti-resonant frequency can be similarly measured from frequency characteristics of admittance Y or an S parameter S11.

Hereafter, $L_1$ denotes a self-inductance of the secondary coil $L_{12}$ of the step-up transformer T1 and $L_2$ denotes a self-inductance of the primary coil $L_{21}$ of the step-down transformer T2. In addition, $k_{m1}$ denotes a coupling coefficient of the step-up transformer T1 and $k_{m2}$ denotes a coupling coefficient of the step-down transformer T2.

Figure 2:
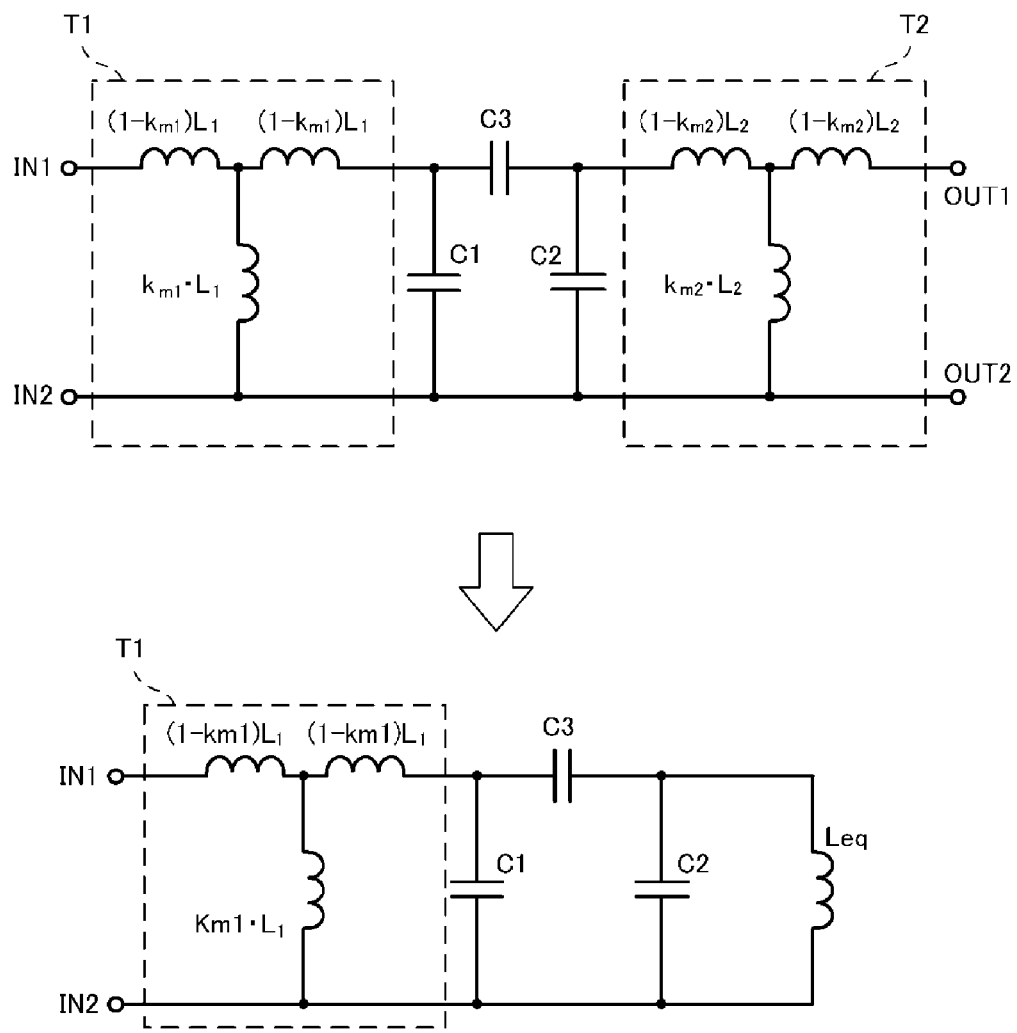
FIG. 2 illustrates an equivalent circuit of a capacitive coupling unit.

FIG. 2 illustrates an equivalent circuit of the capacitive coupling unit. In an upper part of FIG. 2, the step-up transformer T1 and the step-down transformer T2 are represented as T-type equivalent circuits. In these T-type equivalent circuits only equivalent circuits of inductance portions of the step-up transformer T1 and the step-down transformer T2 are illustrated and illustration of an ideal transformer, which is a voltage transformation unit, is omitted. Hereafter, in the figure, $C_1$ denotes the capacitance of a capacitor C1, $C_2$ denotes the capacitance of a capacitor C2 and $C_3$ denotes the capacitance of a capacitor C3. The lower part of FIG. 2 illustrates a circuit diagram for the case where the T-type equivalent circuit of the step-down transformer T2 is replaced with a single inductor Leq.

Input terminals IN1 and IN2 illustrated in FIG. 2 correspond to the measurement locations M1 and M2 in FIG. 1 and the DC-AC inverter circuit of FIG. 1 is connected to the input terminals IN1 and IN2. In addition, the diode bridge DB illustrated in FIG. 1 is connected to output terminals OUT1 and OUT2.

Figure 3:
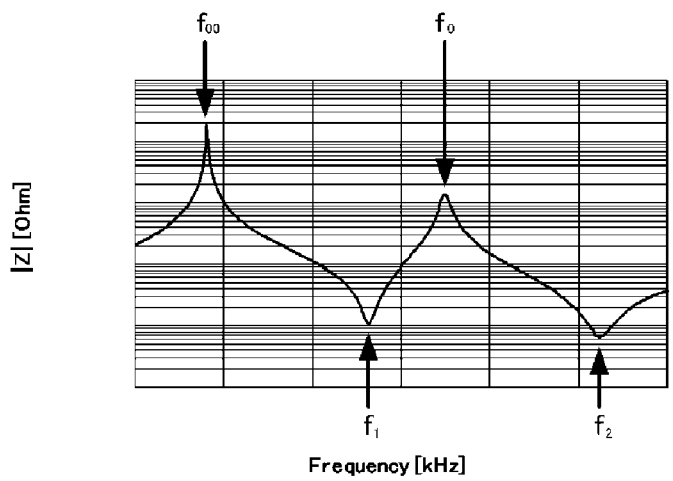
FIG. 3 illustrates measurement results of frequency characteristics in a case where a capacitor section is not short circuited.

First, the resonant frequency and anti-resonant frequency are measured at the input terminals IN1 and IN2 in the case where a capacitor C2 section (that is, active electrode and passive electrode of power reception device) is not short circuited and in the case where the capacitor C2 section is short circuited. First, the frequency characteristics of the impedance of the circuit seen from the input terminals IN1 and IN2 in a state where the capacitor C2 section is not short circuited are measured. FIG. 3 illustrates measurement results of frequency characteristics in a case where capacitor C2 section is not short circuited. In the case where the capacitor C2 section is not short circuited, resonant frequencies $f_1$ and $f_2$ and anti-resonant frequencies $f_{00}$ and $f_0$ can be measured as illustrated in FIG. 3.

At the time of measurement, coupling between the load and the resonance circuit is made weak so that a Q of the power-reception-side resonance circuit is not allowed to decrease. In the case where the measurement is performed using a minute signal, provided that the load and the resonance circuit are separated from each other using a diode bridge as in this embodiment, the coupling can be made weak even when the load is connected. Any appropriate means for making the coupling weak (not physically connecting the load, providing a switch to disconnect the load and the resonance circuit) may be applied.

Figure 4:
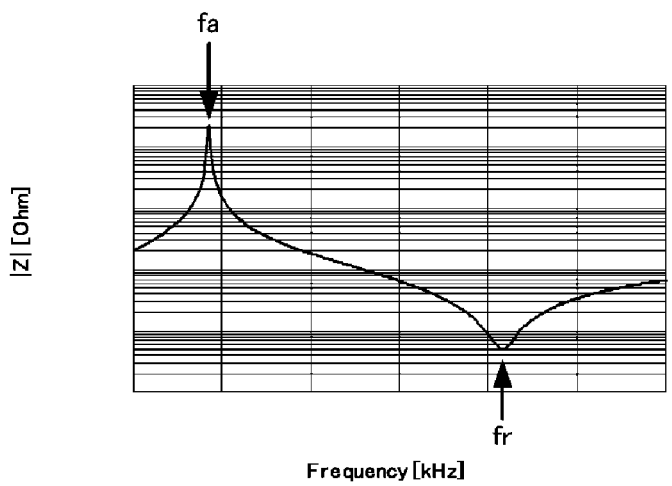
FIG. 4 illustrates measurement results of frequency characteristics in a case where a capacitor section is short circuited.

In addition, the frequency characteristics of the impedance of the circuit seen from the input terminals IN1 and IN2 in a state where the capacitor C2 section is short circuited are measured. FIG. 4 illustrates measurement results of frequency characteristics in the case where capacitor C2 section is short circuited. In the case where the capacitor C2 section is short circuited, a resonant frequency fr and an anti-resonant frequency fa can be measured as illustrated in FIG. 4.

Hereafter, angular frequencies corresponding to the resonant frequencies $f_1$ and $f_2$ and the anti-resonant frequencies $f_{00}$ and $f_0$ are denoted by $\omega_1$ and $\omega_2$ ($\omega_1 \leq \omega_2$) and $\omega_{00}$ and $\omega_0$. In addition, angular frequencies corresponding to the resonant frequency fr and the anti-resonant frequency fa are denoted by $\omega r$ and $\omega a$.

An input impedance Zin in the case where the capacitor C2 section is not short circuited in the circuit illustrated in the lower part of FIG. 2 can be expressed by the following Equation (1).

Equation 1

$$Z_{in} = j\omega L_1 \frac{(1-\omega^2 L_{eq}C_L) - \omega^2(1-k_{m1}^2)(L_1 C_G - (1-k_e^2)\omega^2 L_1 L_{eq} C_G C_L)}{1 - \omega^2(L_1 C_G + L_{eq}C_L - (1-k_e^2)\omega^2 L_1 L_{eq} C_G C_L)} \quad (1)$$

where
$C_G = C_1 + C_3$
$C_L = C_2 + C_3$
$k_e = \dfrac{C_3}{\sqrt{C_G C_L}}$

By making Leq=0 in Equation (1), the input impedance Zin in the case where the capacitor C2 section is short circuited can be derived, giving the following Equation (2).

Equation 2

$$Z_{in} = j\omega L_1 \frac{1 - (1-k_{m1}^2)\omega^2 L_1 C_G}{1 - \omega^2 L_1 C_G} \quad (2)$$

The resonant frequency $\omega r$ in the case where the capacitor C2 section is short circuited is the frequency when Zin=0, that is, when the numerator of Equation (2) is 0 and the relational expression of Equation (3) holds true.

Equation 3

$$\omega_r^2 = \frac{1}{(1-k_{m1}^2)L_1 C_G} = \frac{1}{L_{1S} C_G} \quad (3)$$

Here, $L_{1S}$ is a leakage inductance of the step-up transformer T1.

In addition, the anti-resonant frequency $\omega a$ in the case where the capacitor C2 section is short circuited is the frequency when Zin=∞, that is, when the denominator of Equation (2) is 0 and the relational expression of Equation (4) holds true.

Equation Math 4

$$\omega_a^2 = \frac{1}{L_1 C_G} \quad (4)$$

Here, considering an LC resonance circuit made up of the capacitance $C_L=C_2+C_3$ and the inductor Leq in the circuit illustrated in the lower part of FIG. 2, the following Equation (5) is defined.

Equation Math 5

$$\omega_{eq}^2 \equiv \frac{1}{L_{eq} C_L} \quad (5)$$

The anti-resonant frequencies $\omega_{00}$ and $\omega_0$ in the case where the capacitor C2 section is not short circuited are frequencies at which Zin=∞. Zin=∞ when the denominator of Equation (1) is 0 and is expressed by the following Equation (6).

Equation Math 6

$$1-\omega^2(L_1 C_G + L_{eq} C_L - (1-k_e^2)\omega^2 L_1 L_{eq} C_G C_L) = 0 \quad (6)$$

Substituting the anti-resonant frequencies $\omega_{00}$ and $\omega_0$ into Equation (6), the relational expressions of the following Equation (7) and Equation (8) hold true.

Equation Math 7

$$1-\omega_{00}^2(L_1 C_G + L_{eq} C_L - (1-k_e^2)\omega_{00}^2 L_1 L_{eq} C_G C_L) = 0 \quad (7)$$

$$1-\omega_0^2(L_1 C_G + L_{eq} C_L - (1-k_e^2)\omega_0^2 L_1 L_{eq} C_G C_L) = 0 \quad (8)$$

Substituting Equation (4) and Equation (5) into Equation (7) and Equation (8) and rearranging, the relational expressions of the following Equation (9) and Equation (10) hold true.

Equation Math 8

$$\left(1 - \frac{\omega_{00}^2}{\omega_{eq}^2}\right) - \frac{\omega_{00}^2}{\omega_a^2}\left(1 - (1-k_e^2)\frac{\omega_{00}^2}{\omega_{eq}^2}\right) = 0 \quad (9)$$

$$\left(1 - \frac{\omega_0^2}{\omega_{eq}^2}\right) - \frac{\omega_0^2}{\omega_a^2}\left(1 - (1-k_e^2)\frac{\omega_0^2}{\omega_{eq}^2}\right) = 0 \quad (10)$$

The resonant frequencies $\omega_1$ and $\omega_2$ in the case where the capacitor C2 section is not short circuited are frequencies at which Zin=0. Zin=0 when the numerator of Equation (1) is 0 and is expressed by the following Equation (11).

Equation 9

$$(1-\omega^2 L_{eq} C_L) - \omega^2(1-k_{m1}^2)(L_1 C_G - (1-k_e^2) \omega^2 L_1 L_{eq} C_G C_L) = 0 \quad (11)$$

Substituting the resonant frequencies $\omega_1$ and $\omega_2$ into Equation (11), the relational expressions of the following Equation (12) and Equation (13) hold true.

Equation 10

$$(1-\omega_1^2 L_{eq} C_L) - \omega_1^2(1-k_{m1}^2)(L_1 C_G - (1-k_e^2) \omega_1^2 L_1 L_{eq} C_G C_L) = 0 \quad (12)$$

$$(1-\omega_2^2 L_{eq} C_L) - \omega_2^2(1-k_{m1}^2)(L_1 C_G - (1-k_e^2) \omega_2^2 L_1 L_{eq} C_G C_L) = 0 \quad (13)$$

Substituting Equation (3) and Equation (5) into Equation (12) and Equation (13) and rearranging, the relational expressions of the following Equation (14) and Equation (15) hold true.

Equation 11

$$\left(1 - \frac{\omega_1^2}{\omega_{eq}^2}\right) - \frac{\omega_1^2}{\omega_r^2}\left(1 - (1-k_e^2)\frac{\omega_1^2}{\omega_{eq}^2}\right) = 0 \quad (14)$$

$$\left(1 - \frac{\omega_2^2}{\omega_{eq}^2}\right) - \frac{\omega_2^2}{\omega_r^2}\left(1 - (1-k_e^2)\frac{\omega_2^2}{\omega_{eq}^2}\right) = 0 \quad (15)$$

Solving for the coupling coefficient ke using the resonant frequencies $\omega_{00}$, $\omega_0$ and $\omega a$ obtained through measurements, the coupling coefficient ke (ke>0) can be expressed by the following Equation (16) from Equation (9) and Equation (10).

Equation 12

$$k_e = \sqrt{1 - \left(\frac{\omega_a \omega_{eq}}{\omega_{00} \omega_0}\right)^2} \quad (16)$$

where $$\frac{1}{\omega_{eq}^2} = \frac{1}{\omega_0^2} + \frac{1}{\omega_{00}^2} - \frac{1}{\omega_a^2}$$

On the other hand, solving for the coupling coefficient ke from Equation (14) and Equation (15) using the resonant frequencies $\omega_1$, $\omega_2$ and $\omega r$ obtained through measurements, the coupling coefficient ke (ke>0) can be expressed by the following Equation (17).

Equation 13

$$k_e = \sqrt{1 - \left(\frac{\omega_r \omega_{eq}}{\omega_1 \omega_2}\right)^2} \quad (17)$$

where $$\frac{1}{\omega_{eq}^2} = \frac{1}{\omega_1^2} + \frac{1}{\omega_2^2} - \frac{1}{\omega_r^2}$$

Thus, by using the anti-resonant frequencies $\omega_{00}$, $\omega_0$ and $\omega a$ or the resonant frequencies $\omega_1$, $\omega_2$ and $\omega r$, the coupling coefficient ke of the electrodes of the power transmission device 101 and the electrodes of the power reception device 201, which capacitively couple with each other, can be derived from Equation (16) or Equation (17). By deriving the coupling coefficient ke, the size of the capacitive coupling can be obtained and from that the magnitude of the power transmission efficiency can be determined. In addition, Equations (16) and (17) are not only derived from Equations (9) and (10) and Equations (14) and (15) respectively and can be derived by forming and calculating simultaneous equations using any two equations among Equations (9), (10), (14) and (15).

Next, a method of deriving values of capacitances of an equivalent circuit of a capacitive coupling unit using the derived coupling coefficient ke will be described.

First, the inductance $L_1$ of the secondary coil $L_{12}$ of the step-up transformer T1 and an inductance Leq of the inductor Leq are measured. As a method for measuring the inductance of the secondary coil $L_{12}$, for example, a parallel resonance circuit made up of the secondary coil $L_{12}$ and a parasitic capacitance possessed by the secondary coil $L_{12}$ is considered, the frequency characteristics of this circuit are measured and the inductance $L_1$ of the inductor $L_{12}$ is derived from these results. In the case where the step-up transformer T1 of the power transmission device 101 has been provided with a shield, the inductance $L_1$ is measured in a state where the shield is fitted. It is preferable that the values of the inductances of step-up and step-down transformers be measured in a state where the transformers are incorporated into the devices.

The inductance of the inductor Leq can be derived by measuring the inductance $L_2$ of the primary coil $L_{21}$ of the step-down transformer T2. The method for measuring the inductance of the primary coil $L_{21}$ of the step-down transformer T2 is the same as the method for measuring the inductance of the secondary coil $L_{12}$ of the step-up transformer T1. In the equivalent circuit of FIG. 2, the output terminals OUT1 and OUT2 are open in the case where the capacitor C2 section is not short circuited, and the inductance Leq of the inductor Leq in this case is $L_2$, that is, the inductance of the primary coil $L_{21}$ of the step-down transformer T2. In addition, in the case where the secondary coil of the step-down transformer T2 is short circuited, Leq of the equivalent circuit of FIG. 2 is the leakage inductance of the step-down transformer T2. The inductance Leq of the inductor Leq in this case is $(1-k_{m2}^2)L_2$. Whether the secondary coil of the step-down transformer T2 is to be short circuited or open should be appropriately selected in accordance with the circuit. (Ease of measurement of the resonant frequency (anti-resonant frequency) is an aim.) Next, the capacitances $C_G$, $C_L$, $C_1$, $C_2$ and $C_3$ are derived using the measured inductance $L_2$ and the derived inductance Leq. The following Equation (18) and Equation (19) are obtained by respectively modifying Equation (4) and Equation (5).

Equation 14

$$C_G = \frac{1}{L_1 \omega_a^2} \quad (18)$$

$$C_L = \frac{1}{L_{eq} \omega_{eq}^2} \quad (19)$$

Since the inductances $L_2$ and Leq and the resonant frequency $\omega a$ are known from design values set in advance or from values obtained from measurements, the capacitances $C_1$, $C_2$ and $C_3$ can be derived from the relational expressions $C_G = C_1 + C_3$, $C_L = C_2 + C_3$ and $ke = C_3/\sqrt{(C_G \cdot C_L)}$ and Equation (4), Equation (18) and Equation (19) described above. As a result of deriving the capacitances $C_1$, $C_2$ and $C_3$, work in which the active electrodes 11 and 21 and the passive electrodes 12 and 22 are repeatedly designed using a "cut and try" process in order to obtain optimum capacitance values is reduced.

In this embodiment, a method for deriving the coupling coefficient ke and the values of the capacitances C1, C2 and C3 by focusing on the input impedance seen from the power transmission device 101 has been described, but the parameters may instead be derived by focusing on the input impedance seen from the power reception device 201.

Figure 5:
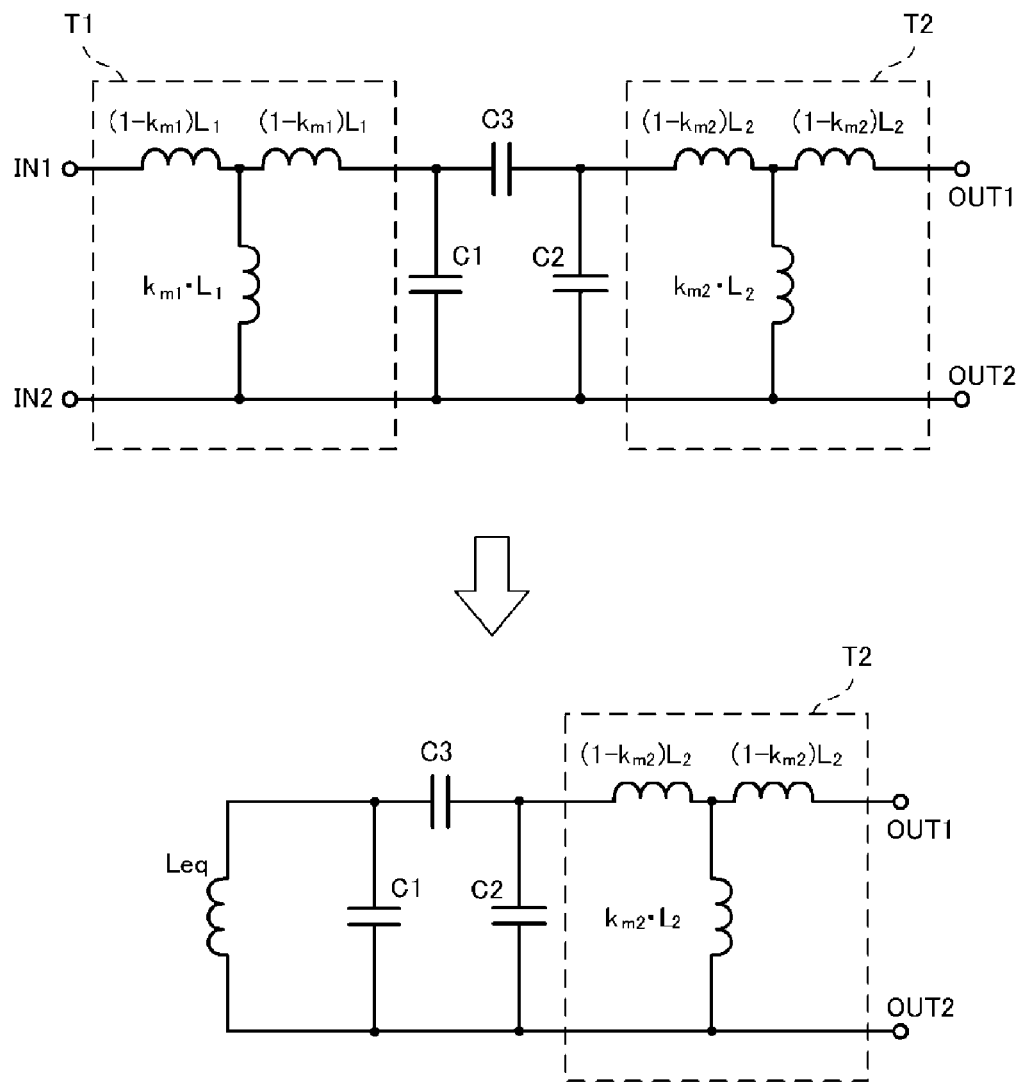
FIG. 5 illustrates an equivalent circuit of a capacitive coupling unit.

FIG. 5 illustrates an equivalent circuit of a capacitive coupling unit in the case where the input impedance seen from the power reception device 201 is focused upon. In the circuit illustrated in the lower part of FIG. 5, the T-type equivalent circuit of the step-up transformer T1 has been replaced with a single inductor Leq. The resonant frequency and the anti-resonant frequency are measured for the circuit illustrated in FIG. 5 in the case where the capacitor C1 section (that is, the active electrode and the passive electrode of the power transmission device) is short circuited and in the case where it is not short circuited and the coupling coefficient ke can be derived from Equation (16) or Equation (17).

When the measurement is performed with the primary side (low voltage side) of the power transmission transformer not short circuited (case in which power transmission resonance circuit is made to operate as parallel resonance circuit), it is necessary to make the coupling between the power supply circuit and the resonance circuit weak so that a Q of the power-transmission-side resonance circuit will not be reduced. In the case where the measurement is performed using a minute signal, provided that the power supply (=Cin) and the resonance circuit are separated from each other with a bridge circuit as in FIG. 1, the coupling can be made weak even when the power supply is connected. Any appropriate means for making the coupling weak (not physically connecting the power supply, providing a switch to disconnect the power supply and the resonance circuit) may be applied. In the case where the primary side of the power transmission transformer is short circuited, no particular considerations are necessary.

In addition, the capacitors C1, C2 and C3 shown in the circuit illustrated in FIG. 5 can be derived using the following Equation (20) and Equation (21). The following Equation (20) and Equation (21) can be derived similarly to as in the above-described embodiment by short circuiting the capacitor C1.

Equation 15

$$C_G = \frac{1}{L_2 \omega_a^2} \quad (20)$$

$$C_L = \frac{1}{L_{eq} \omega_{eq}^2} \quad (21)$$

where
$C_1 = C_L - C_3$
$C_2 = C_G - C_3$
$C_3 = ke\sqrt{C_G C_L}$

REFERENCE SIGNS LIST

11—active electrode (first electrode)
12—passive electrode (second electrode)
21—active electrode (third electrode)
22—passive electrode (fourth electrode)
101—power transmission device
201—power reception device
300—wireless power transmission system
C1, C2, C3—capacitor
M1, M2—measurement location
IN1, IN2—input terminal
OUT1, OUT2—output terminal
T1—step-up transformer
T2—step-down transformer
$L_{11}$, $L_{21}$—primary coil
$L_{12}$, $L_{22}$—secondary coil

The invention claimed is:

1. A method for determining parameters of a wireless power transmission system that transmits power from a power transmission device to a power reception device by electric field coupling, where the power transmission device includes first and second electrodes and a step-up transformer that outputs a stepped up alternating current voltage between the first and second electrodes, and the power reception device includes third and fourth electrodes and a step-down transformer that steps down a voltage induced in the third and fourth electrodes when facing the first and second electrodes, respectively, the method comprising:

measuring at least one of a resonant frequencies $\omega_1$ and $\omega_2$ and anti-resonant frequencies $\omega_{00}$ and $\omega_0$ of an input impedance from a primary side of the step-up transformer when the third and fourth electrodes are in an open state;

measuring at least one of a resonant frequency $\omega r$ and an anti-resonant frequency $\omega a$ of an input impedance from the primary side of the step-up transformer when the third and fourth electrodes are short circuited; and determining a coupling coefficient ke of an electric field coupling unit that includes the first, second, third and fourth electrodes, where the coupling coefficient ke is determined according to either Equation (A) or Equation (B), wherein Equation (A) is:

$$k_e = \sqrt{1 - \left(\frac{\omega_a \omega_{eq}}{\omega_{00} \omega_0}\right)^2}$$

where $$\frac{1}{\omega_{eq}^2} = \frac{1}{\omega_0^2} + \frac{1}{\omega_{00}^2} - \frac{1}{\omega_a^2},$$

and
Equation (B) is:

$$k_e = \sqrt{1 - \left(\frac{\omega_r \omega_{eq}}{\omega_1 \omega_2}\right)^2}$$

where $$\frac{1}{\omega_{eq}^2} = \frac{1}{\omega_1^2} + \frac{1}{\omega_2^2} - \frac{1}{\omega_r^2}.$$

2. The method according to claim 1, wherein the third electrode of the power reception device faces the first electrode of the power transmission device with a gap therebetween, and the fourth electrode of the power reception device faces the second electrode of the power transmission device with a gap therebetween or is in contact with the second electrode.

3. The method according to claim 2, wherein the power reception device includes a rectification smoothing circuit that rectifies and smoothes the stepped down voltage output from the step-down transformer.

4. The method according to claim 1, further comprising determining an equivalent inductance $L_{eq}$ of a resonance circuit that includes the step-down transformer of the power reception device.

5. The method according to claim 4, wherein the determining of the equivalent inductance $L_{eq}$ comprises measuring the inductance $L_{eq}$ of the resonance circuit.

6. The method according to claim 5, wherein the measuring of the equivalent inductance of the inductor Leq comprises measuring an inductance of a primary coil of the step-down transformer of the power reception device.

7. The method according to claim 4, further comprising determining a self-inductance $L_1$ of the secondary coil of the step-up transformer of the power transmission device.

8. The method according to claim 7, wherein the power transmission system further includes an equivalent circuit of a capacitive coupling unit that comprises a first capacitor connected in parallel with the secondary coil of the step-up transformer, a second capacitor connected in parallel with a primary coil of the step-down transformer, a third capacitor connected between the first capacitor and the second capacitor, and wherein the method further comprising determining a capacitance $C_1$ of the first capacitor, a capacitance $C_2$ of the second capacitor and a capacitance $C_3$ of the third capacitor, wherein $$C_G = \frac{1}{L_1 \omega_a^2}$$

$$C_L = \frac{1}{L_{eq} \omega_{eq}^2}$$

$$C_1 = C_G - C_3$$
$$C_2 = C_L - C_3$$
$$C_3 = k_e \sqrt{C_G C_L}.$$

9. A method for determining parameters of a wireless power transmission system that transmits power from a power transmission device to a power reception device by electric field coupling, where the power transmission device includes first and second electrodes an a step-up transformer that outputs a stepped up alternating current voltage between the first and second electrodes, and a power reception device includes third and fourth electrodes and a step-down transformer that steps down a voltage induced in the third and fourth electrodes when facing the first and second electrodes, the method comprising:

measuring at least one of a resonant frequencies $\omega_1$ and $\omega_2$ and anti-resonant frequencies $\omega_{00}$ and $\omega_0$ of an input impedance from a secondary side of the step-down transformer when the first and second electrodes are in an open state;

measuring at least one of a resonant frequency $\omega r$ and an anti-resonant frequency $\omega a$ of an input impedance from the secondary side of the step-down transformer when the first and second electrodes are short circuited; and determining a coupling coefficient ke of an electric field coupling unit that includes the first, second, third and fourth electrodes, where the coupling coefficient ke is determined according to either Equation (A) or Equation (B), wherein Equation (A) is:

$$k_e = \sqrt{1 - \left(\frac{\omega_a \omega_{eq}}{\omega_{00} \omega_0}\right)^2}$$

where $$\frac{1}{\omega_{eq}^2} = \frac{1}{\omega_0^2} + \frac{1}{\omega_{00}^2} - \frac{1}{\omega_a^2},$$

and
Equation (B) is:

$$k_e = \sqrt{1 - \left(\frac{\omega_r \omega_{eq}}{\omega_1 \omega_2}\right)^2}$$

where $$\frac{1}{\omega_{eq}^2} = \frac{1}{\omega_1^2} + \frac{1}{\omega_2^2} - \frac{1}{\omega_r^2}.$$

10. The method according to claim 9, wherein the third electrode of the power reception device faces the first electrode of the power transmission device with a gap therebetween, and the fourth electrode of the power reception device faces the second electrode of the power transmission device with a gap therebetween or is in contact with the second electrode.

11. The method according to claim 10, wherein the power reception device includes a rectification smoothing circuit that rectifies and smoothes the stepped down voltage output from the step-down transformer.

12. The method according to claim 9, further comprising determining an equivalent inductance $L_{eq}$ of a resonance circuit that includes the step-up transformer of the power transmission device.

13. The method according to claim 12, wherein the determining of the equivalent inductance $L_{eq}$ comprises measuring the inductance $L_{eq}$ of the resonance circuit.

14. The method according to claim 13, wherein the measuring of the equivalent inductance of the inductor Leq comprises measuring an inductance of a secondary coil of the step-up transformer of the power transmission device.

15. The method according to claim 12, further comprising determining a self-inductance $L_2$ of the primary coil of the step-down transformer of the power reception device.

16. The method according to claim 15, wherein the power transmission system further includes an equivalent circuit of a capacitive coupling unit that comprises a first capacitor connected in parallel with the secondary coil of the step-up transformer, a second capacitor connected in parallel with a primary coil of the step-down transformer, a third capacitor connected between the first capacitor and the second capacitor, and wherein the method further comprising determining a capacitance $C_1$ of the second capacitor, a capacitance $C_2$ of the first capacitor and a capacitance $C_3$ of the third capacitor, wherein $$C_G = \frac{1}{L_1 \omega_a^2}.$$

$$C_L = \frac{1}{L_{eq} \omega_{eq}^2}$$

$$C_1 = C_L - C_3$$

$$C_2 = C_G - C_3$$

$$C_3 = k_e \sqrt{C_G C_L}.$$

* * * * *